United States Patent
Chang et al.

(10) Patent No.: US 8,634,789 B2
(45) Date of Patent: Jan. 21, 2014

(54) MULTI-MODE POWER AMPLIFIER

(71) Applicant: Skyworks Solutions, Inc., Woburn, MA (US)

(72) Inventors: Shiaw Wen Chang, Thousand Oaks, CA (US); Xuejun Chen, Moorpark, CA (US); Guohao Zhang, Irvine, CA (US); Jing Sun, Portland, OR (US); Piyou Zhang, Aloha, OR (US); Jinim Won, Santa Clarita, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 13/672,981

(22) Filed: Nov. 9, 2012

(65) Prior Publication Data

US 2013/0130750 A1    May 23, 2013

Related U.S. Application Data

(60) Provisional application No. 61/558,268, filed on Nov. 10, 2011.

(51) Int. Cl.
*H04B 1/06*    (2006.01)

(52) U.S. Cl.
USPC .......................... 455/242.1; 455/571; 330/295

(58) Field of Classification Search
USPC ............. 455/571, 242.1, 243.2, 240.1, 246.1; 330/295, 151, 129
See application file for complete search history.

(56) References Cited

U.S. PATENT DOCUMENTS

| | | | |
|---|---|---|---|
| 4,803,443 A | 2/1989 | Takagi et al. | |
| 5,541,554 A | 7/1996 | Stengel et al. | |
| 6,366,788 B1 | 4/2002 | Fujioka et al. | |
| 6,472,935 B2 | 10/2002 | King et al. | |
| 6,954,623 B2 | 10/2005 | Chang et al. | |
| 7,071,873 B2 | 7/2006 | Tomasic et al. | |
| 7,193,472 B2 | 3/2007 | Gotou et al. | |
| 7,345,537 B2 | 3/2008 | Apel et al. | |
| 7,876,160 B2 | 1/2011 | Zhang et al. | |
| 7,912,499 B2 | 3/2011 | Ouzillou | |
| 8,049,565 B2 | 11/2011 | Zhang et al. | |
| 2002/0186079 A1 | 12/2002 | Kobayashi | |
| 2006/0164163 A1* | 7/2006 | Apel et al. | 330/151 |
| 2007/0165743 A1 | 7/2007 | McCallister et al. | |
| 2008/0048774 A1 | 2/2008 | Chang et al. | |
| 2009/0210731 A1* | 8/2009 | Lakkapragada et al. | 713/320 |
| 2011/0095828 A1 | 4/2011 | Zhang et al. | |
| 2012/0044980 A1 | 2/2012 | Zhang et al. | |

FOREIGN PATENT DOCUMENTS

WO    WO 2004/084422 A2    9/2004

* cited by examiner

*Primary Examiner* — Phuoc H Doan
(74) *Attorney, Agent, or Firm* — Knobbe, Martens, Olson & Bear, LLP

(57) ABSTRACT

A multi-mode power amplifier includes a high-power mode amplifier circuit, a mid-power mode amplifier circuit, and a low power amplifier circuit, where the low-power mode amplifier circuit comprises a plurality of independently selectable power cell/amplifier branches. The multi-mode power amplifiers selectively enable or disable amplifier branches to provide multiple levels of amplification. Selectively enabling certain of a plurality of split collector amplifier branches provides multiple low power and ultra-low power amplifier modes without the impedance mismatch or board layout problems associated with an RF switch.

20 Claims, 11 Drawing Sheets

MULTI-MODE POWER AMPLIFIER

INCORPORATION BY REFERENCE

This application claim the benefit of priority under 35 U.S.C. §119(e) of U.S. Provisional Patent Application No. 61/558,268, filed Nov. 10, 2011, and titled "MULTI-MODE POWER AMPLIFIER", the entirety of which is hereby incorporated herein by reference to be considered a part of this specification. Also, the disclosure of U.S. application Ser. No. 12/273,093, filed Nov. 18, 2008, titled "MULTI-MODE HIGH EFFICIENCY LINEAR POWER AMPLIFIER", now U.S. Pat. No. 7,876,160, is expressly incorporated by reference in its entirety and is to be considered part of the specification of the present application.

BACKGROUND

Portable communication devices, such as cellular telephones, personal digital assistants (PDAs), WIFI transceivers, and other communication devices transmit and receive communication signal at various frequencies that correspond to different communication bands and at varying power levels. A power amplifier module, generally comprising one or more amplification stages, is used to transmit the communication signals. A radio frequency (RF) power amplifier system may include multiple amplification stages, and, in some applications, multiple amplification paths. The efficiency of the power amplifier system is generally determined by a number of factors, and to a large degree, determines the amount of power consumed by the power amplifier system.

Various ways of measuring and determining the efficiency of the power amplifier are available. One measure of power amplifier efficiency is referred to as "power added efficiency," abbreviated as PAE. The PAE of a power amplifier is dependent upon a number of factors including, but not limited to, the number of power amplification paths, the load impedance at the output of the power amplifier path or paths, impedance matching between multiple stages, and other factors. In a multiple mode power amplification topology, in which two or more power amplification paths are implemented to provide varying power output levels, improving the PAE at low power levels is typically achieved at the expense of power amplifier linearity at higher power levels.

Therefore, it is desirable to improve the PAE of a power amplifier system over a range of power levels, without sacrificing the linearity and performance of the power amplifier system over the range of power output levels.

SUMMARY

Systems and methods disclose a four power mode power amplifier. The power amplifier includes a high-power mode amplifier circuit, a mid-power mode amplifier circuit, and a low power amplifier circuit. The power amplifier further includes an ultra-low-power mode amplifier circuit including an RF switch.

Further systems and methods disclose a multi-mode power amplifier. In certain embodiments, the power amplifier includes a high-power mode amplifier circuit, a mid-power mode amplifier circuit, and a low power amplifier circuit, where the low-power mode amplifier circuit comprises a plurality of independently selectable power cell/amplifier branches. The power amplifier further includes an ultra-low-power mode amplifier circuit including an RF switch.

Yet further systems and methods disclose a multi-mode power amplifier without an RF switch. According to a number of embodiments, the power amplifier includes a high-power mode amplifier circuit, a mid-power mode amplifier circuit, and a low power amplifier circuit, where the low-power mode amplifier circuit comprises a plurality of independently selectable power cell/amplifier branches.

In accordance with various embodiments, the multi-mode power amplifiers selectively enable or disable amplifier branches to provide multiple levels of amplification. In certain embodiments, selectively enabling certain of a plurality of split collector amplifier branches provides multiple low power and ultra-low power amplifier modes without the impedance mismatch or board layout problems associated with an RF switch.

DETAILED DESCRIPTION OF THE PREFERRED EMBODIMENT

The features of the systems and methods will now be described with reference to the drawings summarized above. Throughout the drawings, reference numbers are re-used to indicate correspondence between referenced elements. The drawings, associated descriptions, and specific implementation are provided to illustrate embodiments of the inventions and not to limit the scope of the disclosure.

Figure 1:
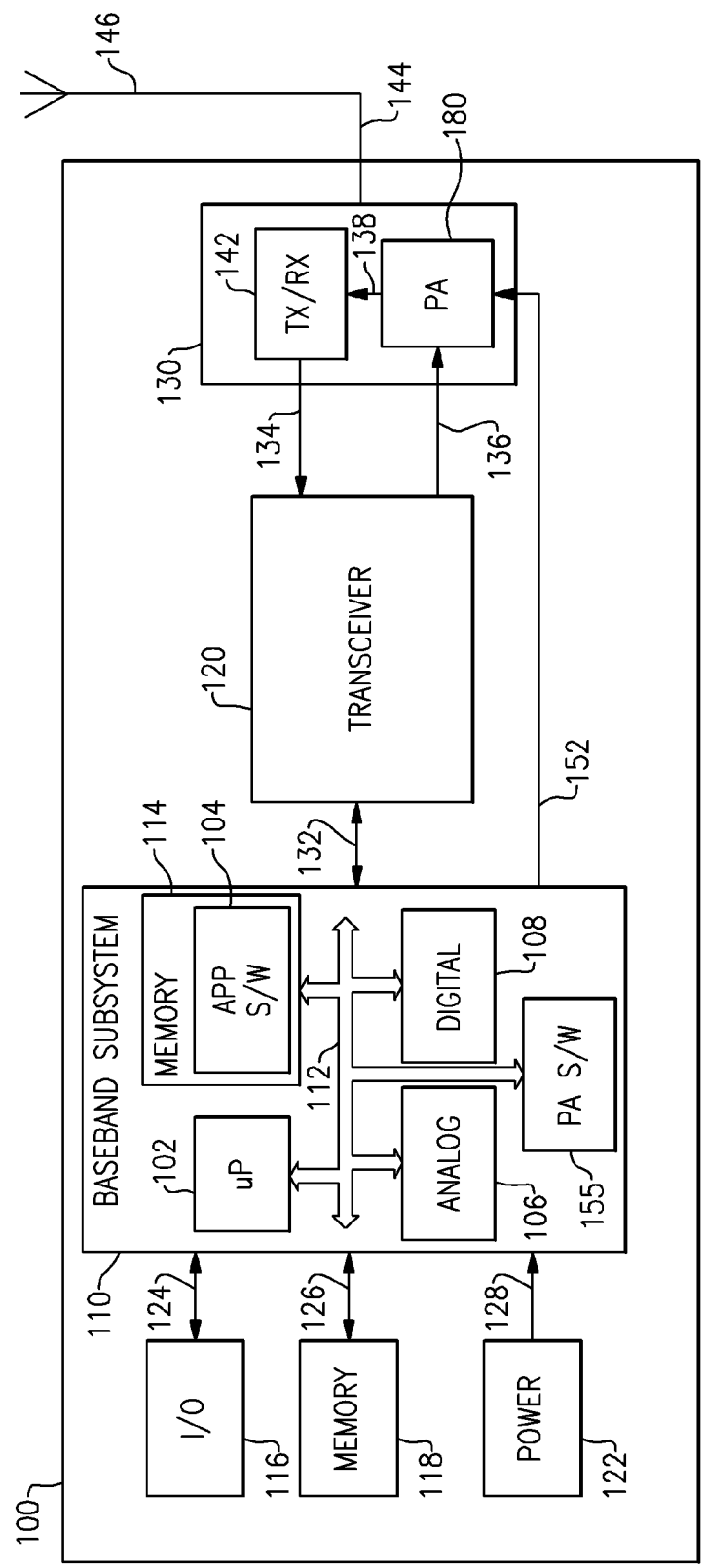
FIG. 1 is an exemplary schematic block diagram illustrating a simplified portable communication device, according to certain embodiments.

FIG. 1 is a block diagram illustrating a simplified portable communication device 100. In an embodiment, the portable communication device 100 can be a portable cellular telephone. Embodiments of the multi-mode power amplifier can be implemented in a device having an RF transmitter, and in this example, are implemented in a portable communication device 100. The portable communication device 100 illustrated in FIG. 1 is intended to be a simplified example of a cellular telephone and to illustrate one of many possible applications in which the multi-mode power amplifier can be implemented. One having ordinary skill in the art will understand the operation of a portable cellular telephone, and, as such, implementation details are omitted. The portable communication device 100 includes a baseband subsystem 110, a transceiver 120, and a front end module (FEM) 130. Although not shown for clarity, the transceiver 120 generally includes modulation and upconversion circuitry for preparing a baseband information signal for amplification and transmission, and includes filtering and downconversion circuitry for receiving and downconverting an RF signal to a baseband information signal to recover data. The details of the operation of the transceiver 120 are known to those skilled in the art.

The baseband subsystem 110 generally includes a processor 102, which can be a general purpose or special purpose microprocessor, memory 114, application software 104, analog circuit elements 106, digital circuit elements 108 and power amplifier software 155, coupled over a system bus 112. The system bus 112 can include the physical and logical connections to couple the above-described elements together and enable their interoperability.

An input/output (I/O) element 116 is connected to the baseband subsystem 110 over connection 124, a memory element 118 is coupled to the baseband subsystem 110 over connection 126 and a power source 122 is connected to the baseband subsystem 110 over connection 128. The I/O element 116 can include, for example, a microphone, a keypad, a speaker, a pointing device, user interface control elements, and any other devices or system that allow a user to provide input commands and receive outputs from the portable communication device 100.

The memory 118 can be any type of volatile or non-volatile memory, and in an embodiment, can include flash memory. The memory element 118 can be permanently installed in the portable communication device 100, or can be a removable memory element, such as a removable memory card.

The power source 122 can be, for example, a battery, or other rechargeable power source, or can be an adaptor that converts AC power to the correct voltage used by the portable communication device 100.

The processor 102 can be any processor that executes the application software 104 to control the operation and functionality of the portable communication device 100. The memory 114 can be volatile or non-volatile memory, and in an embodiment, can be non-volatile memory that stores the application software 104. If portions of the multi-mode power amplifier are implemented in software, then the baseband subsystem 110 also includes power amplifier software 155, which may cooperate with control logic that can be executed by the microprocessor 102, or by another processor, to control the operation of the power amplifier 180 to be described below.

The analog circuitry 106 and the digital circuitry 108 include the signal processing, signal conversion, and logic that convert an input signal provided by the I/O element 116 to an information signal that is to be transmitted. Similarly, the analog circuitry 106 and the digital circuitry 108 include the signal processing, signal conversion, and logic that convert a received signal provided by the transceiver 120 to an information signal that contains recovered information. The digital circuitry 108 can include, for example, a digital signal processor (DSP), a field programmable gate array (FPGA), or any other processing device. Because the baseband subsystem 110 includes both analog and digital elements, it is sometimes referred to as a mixed signal device (MSD).

In an embodiment, the front end module 130 includes a transmit/receive (TX/RX) switch 142 and a power amplifier 180. The TX/RX switch 142 can be a duplexer, a diplexer, or any other physical or logical device or circuitry that separates a transmit signal and a receive signal. Depending on the implementation of the portable communication device 100, the TX/RX switch 142 may be implemented to provide half-duplex or full-duplex functionality. A transmit signal provided by the transceiver 120 over connection 136 is directed to the power amplifier 180. As will be described in detail below, the power amplifier 180 can be implemented as a multi-mode power amplifier, and in the implementation to be described below, will be shown as being implemented using multiple amplification paths. The output of the power amplifier 180 is provided over connection 138 to the TX/RX switch 142, and then to an antenna 146 over connection 144.

A signal received by the antenna 146 is provided over connection 144 to the TX/RX switch 142, which provides the received signal over connection 134 to the transceiver 120.

In an embodiment, the baseband subsystem 110 provides a power or mode selection signal over connection 152 to the power amplifier 180. The mode selection signal determines whether one or more amplification paths within the power amplifier 180 are enabled.

Figure 2:
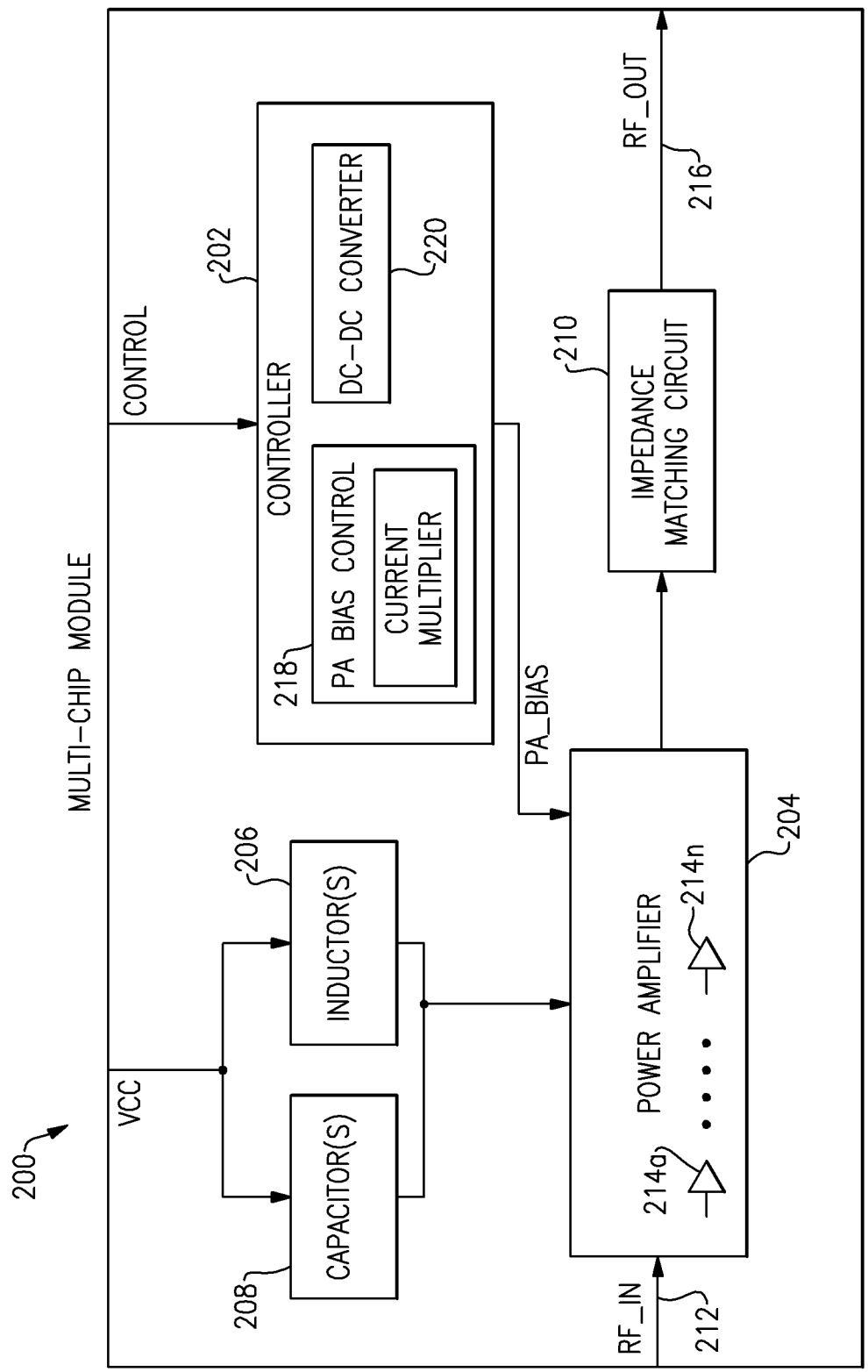
FIG. 2 is an exemplary schematic block diagram of illustrating a multi-chip module including a multi-mode power amplifier, according to certain embodiments.

FIG. 2 is a schematic block diagram of a power amplifier module 200. The illustrated power amplifier module 200 is a multi-chip module (MCM) that can include one or more of a controller die 202, one or more power amplifier die 204, inductor(s) 206, capacitor(s) 208, and an impedance matching component 210. The multi-chip module 200 can include a plurality of dies and/or other components mounted on a carrier substrate of the module. In some implementations, the substrate can be a multi-layer substrate configured to support the dies and/or components and to provide electrical connectivity to external circuitry when the module 200 is mounted on a circuit board, such as a phone board.

The power amplifier die 204 can receive an RF signal 212 on an input pin RFIN of the multi-chip module 200. The power amplifier die 204 can include one or more power amplifiers 214*a*-214*n*, including, for example, multi-mode power amplifiers configured to amplify the RF signal. The amplified RF signal 216 can be provided to an output pin RFOUT of the power amplifier module 200. The impedance matching component 210 can be provided on the power amplifier module 200 to aid in reducing signal reflections and/or other signal distortions. The power amplifier die 204 can be any suitable die. In some implementations, the power amplifier die 204 is a gallium arsenide (GaAs) die. In some of these implementations, the GaAs dies have transistors formed using a heterojunction bipolar transistor (HBT) process.

The multi-chip module 200 can include the inductor(s) 206, which can be formed, for example, by trace on the multi-chip module 200. In an embodiment, the inductor(s) 206 can operate as a choke inductor, and can be disposed between the positive supply voltage VCC and the power amplifier die 204. In some implementations, the inductor(s) 206 are surface mounted. Additionally, in an embodiment, the capacitor(s) 208 can be electrically connected in parallel with the inductor(s) 206 and can be configured to resonate at a frequency near the frequency of a signal received on the pin RFIN. In some implementations, the capacitor(s) 208 include a surface mounted capacitor.

In some implementations, the controller die 202 can be manufactured on a silicon wafer. In some of these implementations, the controller die 202 can be manufactured using complementary metal oxide semiconductor (CMOS) process technology. The controller die 202 can include a power amplifier bias control block 218 and/or a DC-DC converter block 220. The power amplifier bias control block 218 can be used, for example, to provide bias signals to the power amplifier die 204. For example, in a bipolar transistor power amplifier configuration, the controller die 202 can be used to provide a reference voltage for biasing a current mirror used to generate a base current for the power amplifiers, such as a base current for a bipolar transistor. The controller die 202 can also be used to enable and/or disable a power amplifier 214 disposed on the power amplifier die 204, which can aid in selectively activating a power amplifier 214 associated with a particular transmission path. For example, the controller die can receive a control signal 222 on a pin CONTROL, and can use the control signal 222 to vary the bias signal provided to the power amplifier die 204 so as to selectively enable or disable the power amplifier(s) 214a-214n. The controller die 202 can also include one or more current multipliers that include any combination of features described herein.

The multi-chip module 200 can be modified to include more or fewer components, including, for example, additional power amplifier dies 214, capacitors 208 and/or inductors 206. For instance, the multi-chip module 200 can include an additional power amplifier die 204, as well as an additional capacitor 208 and inductor 206 configured to operate as a parallel LC circuit disposed between the additional power amplifier die 204 and a negative supply voltage VEE of the module 200. The multi-chip module 200 can be configured to have additional pins, such as in implementations in which a separate power supply is provided to an input stage disposed on the power amplifier die 204 and/or implementations in which the multi-chip module 200 operates over a plurality of bands.

In an embodiment, a multiple power mode power amplifier optimizes the power consumption of the power amplifier by optimizing the power consumption of each power mode for a specific power range.

Figure 3:
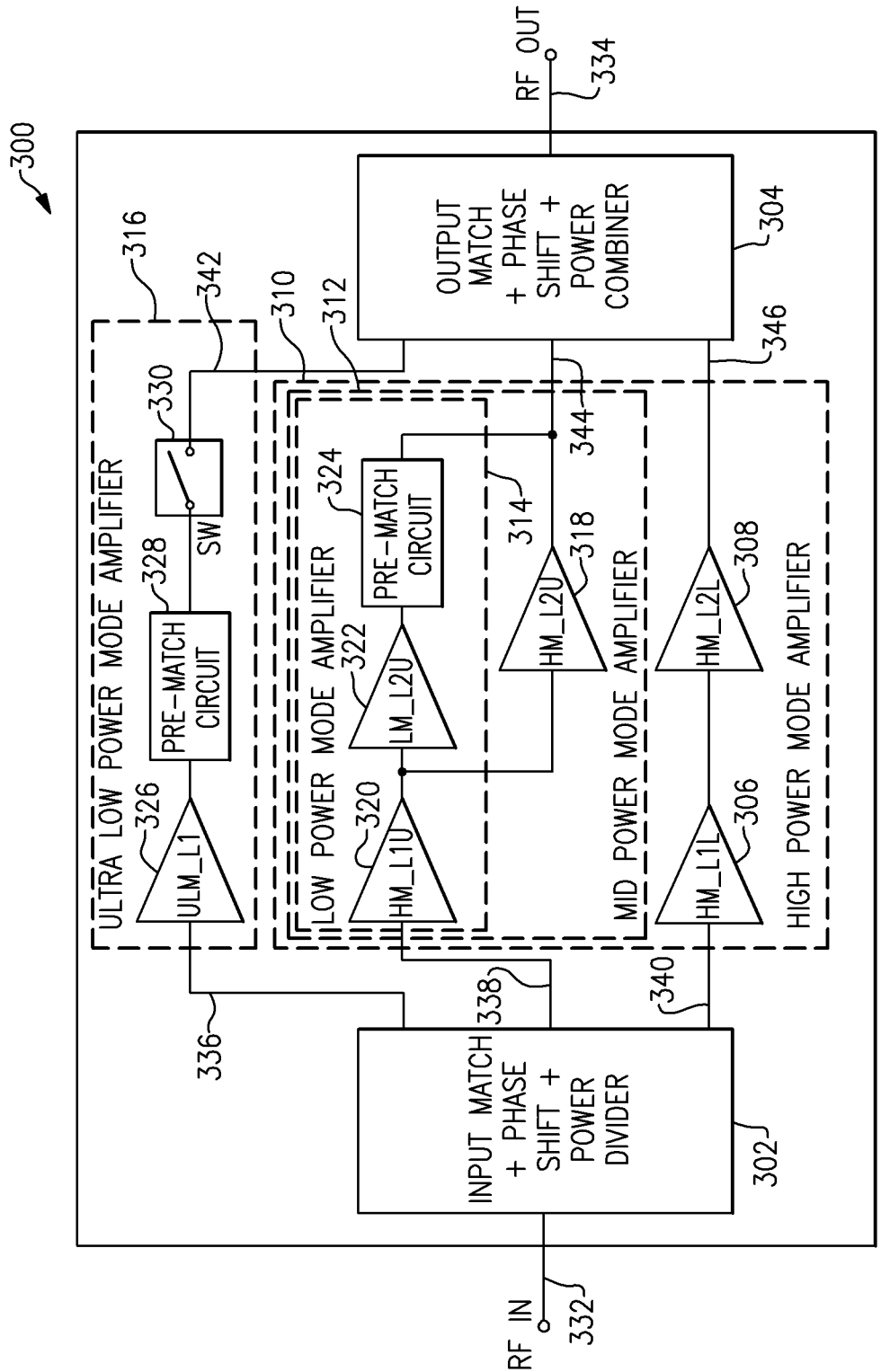
FIG. 3 is an exemplary schematic block diagram of a four-power-mode power amplifier based on a load insensitive power amplifier structure and including a radio frequency (RF) switch, according to certain embodiments.

FIG. 3 is an exemplary schematic block diagram illustrating an embodiment of a four-power-mode power amplifier 300 based on a load insensitive power amplifier structure. The power amplifier 300 receives an RF input signal 332, from, for example, the transceiver 120 of the portable communication device 100, amplifies the RF input signal 332, and provides an RF output signal 334 to, for example, the TX/RX switch 142 on the front end module 130 of the portable communication device 100 for transmission by the antenna 146. The power amplifier 300 comprises four selectable power modes: an ultra-low-power mode, a low-power mode, a mid-power mode, and a high-power mode, where the selection of the power mode depends at least in part on the level of power needed to transmit the RF signal 334. The power amplifier 300 comprises a multi-mode power amplifier preprocessing circuit 302, a high-power mode amplifier circuit 310, an ultra-low-power mode amplifier circuit 316, and a multi-mode power amplifier post processing circuit 304.

The multi-mode power amplifier preprocessing circuit 302 receives the RF input signal 332, phase shifts, impedance matches, and power divides the RF input signal 332, and provides a first output signal 336 to the ultra-low-power mode amplifier circuit 316, a second output signal 338 to the low-power mode amplifier circuit 314, and a third output signal 340 to the high-power mode amplifier circuit 310.

Figure 10:
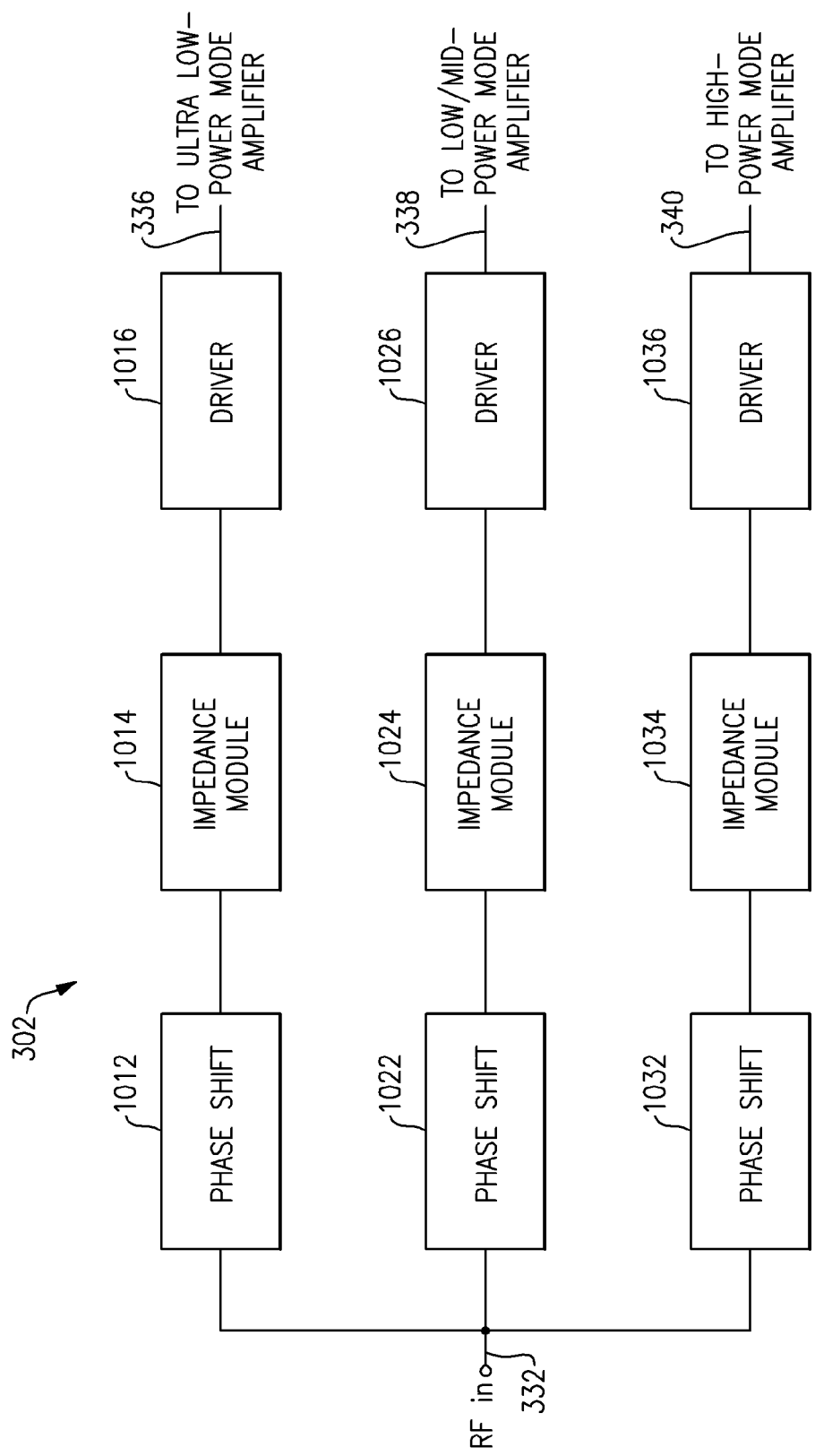
FIG. 10 is an exemplary schematic block diagram of a pre-processing circuit for a multi-mode power amplifier, according to an embodiment.

FIG. 10 is an exemplary schematic block diagram of the preprocessing circuit 302. The preprocessing circuit 302 comprises a first phase shift circuit 1012, a first impedance module 1014, and a first driver circuit 1016 electrically coupled in series.

Phase shift circuits shift the phase of an input signal and provide a phase-shifted output signal. An input of the phase shift circuit 1012 receives the RF input signal 332 and phase shifts the signal. An output of the phase shift circuit 1012 provides a phase shifted signal to an input of the impedance module 1014.

Impedance modules transform the impedance of an input signal to match varying impedances on their output connections caused by, for example, varying load conditions. The impedance module 1014 receives the phase shifted signal from the phase shift circuit 1012 and transforms the impedance of the phase shifted signal. The impedance module 1014 provides the impedance matched signal to an input of the driver circuit 1016.

Driver circuits transform the current and voltage levels of an input signal to provide an output signal with appropriate voltage levels and current to drive the next circuit, which in this embodiment is an amplifier circuit. The driver circuit 1016 receives the impedance matched signal from the impedance module 1014 and provides the first output signal 336 with the appropriate voltage levels and current to drive the amplifier 326 of the ultra-low-power mode amplifier circuit 316.

The preprocessing circuit 302 further comprises a second phase shift circuit 1022, a second impedance module 1024, and a second driver circuit 1026 coupled in series. In a manner similar that that described above with respect to circuits 1012, 1014, 1016, the second phase shift circuit 1022 receives the RF input signal 332 and the second driver circuit 1026 provides the second output signal 338 with the appropriate voltage levels and current to drive the amplifier 320 of the low-power mode amplifier circuit 314.

The preprocessing circuit 302 further comprises a third phase shift circuit 1032, a third impedance module 1034, and a third driver circuit 1036 coupled in series. In a manner similar that that described above with respect to circuits 1012, 1014, 1016, the third phase shift circuit 1032 receives the RF input signal 332 and the third driver circuit 1036 provides the third output signal 340 with the appropriate voltage levels and current to drive the amplifier 306 of the high-power mode amplifier circuit 310. The illustrated embodiment in FIG. 10 shows the phase shift circuit 1012, 1022, 1032 followed by the impedance module 1014, 1024, 1034, which is then followed by the driver circuit 1016, 1026, 1036, respectively. In other embodiments, other series arrangements are possible.

Referring to FIG. 3, the high-power mode amplifier circuit 310 comprises a first power cell/amplifier 306 electrically coupled in series with a second power cell/amplifier 308. An input of amplifier 306 receives the preprocessing signal 340 from the preprocessing circuit 302 and an output of the amplifier 308 provides an amplified signal 346 to the post processing circuit 304. The high-power mode amplifier circuit 310 further comprises a mid-power mode amplifier circuit 312.

The mid-power mode amplifier circuit 312 comprises a power cell/amplifier 318 and a low-power mode amplifier circuit 314. An input of the amplifier 318 electrically couples to the low-power mode amplifier circuit 314 and an output of the amplifier 318 provides an amplified signal 344 to the post processing circuit 304.

The low-power mode amplifier circuit 314 comprises a first power cell/amplifier 320 electrically coupled in series with a second power cell/amplifier 322, and a pre-match circuit 324 electrically coupled between an output of the second amplifier 322 and an output of the mid-power mode amplifier 318. An input of the amplifier 320 receives the preprocessed signal 338 from the preprocessing circuit 302. An input of the mid-power mode amplifier 318 electrically connects to an output of the amplifier 320 and an input of the amplifier 322, or in other words, the input of the amplifier 318 electrically couples to the series connection of the amplifiers 320, 322.

Each power amplifier 306, 308, 318, 320, 322, and 324 can comprise one or more power amplifiers electrically coupled in parallel.

The ultra-low-power mode amplifier circuit 316 comprises an amplifier 326, a pre-match circuit 328, and a radio frequency (RF) switch 330. In an embodiment, the ultra-low-power mode amplifier 326 provides an ultra-low-power mode branch when collector impedance is difficult to achieve in the low-power mode amplifier circuit 314. An input of the amplifier 326 receives the preprocessed signal 336 from the preprocessing circuit 302 and an output of the amplifier 326 electrically connects to an input of the pre-match circuit 328. An output of the pre-match circuit 328 electrically connects to an input of the switch 330. The output of the switch 330 electrically connects to the post processing circuit 304 and provides, when the switch is closed, the amplified signal 342 to the post processing circuit 304. In an embodiment, the RF switch 330 is a pseudomorphic High Electron Mobility Transistor (pHEMT) switch. In other embodiments, the switch 330 other types of switches are used. The power amplifier 326 can comprise one or more power amplifiers electrically coupled in parallel.

The multi-mode power amplifier post processing circuit 304 receives the output signals 346, 344, 342 of the power amplifier circuits 310, 312, 316, respectively, and phase shifts, impedance matches and power combines the amplifier circuit output signals 346, 344, 342 to generate the RF output signal 334.

Figure 11:
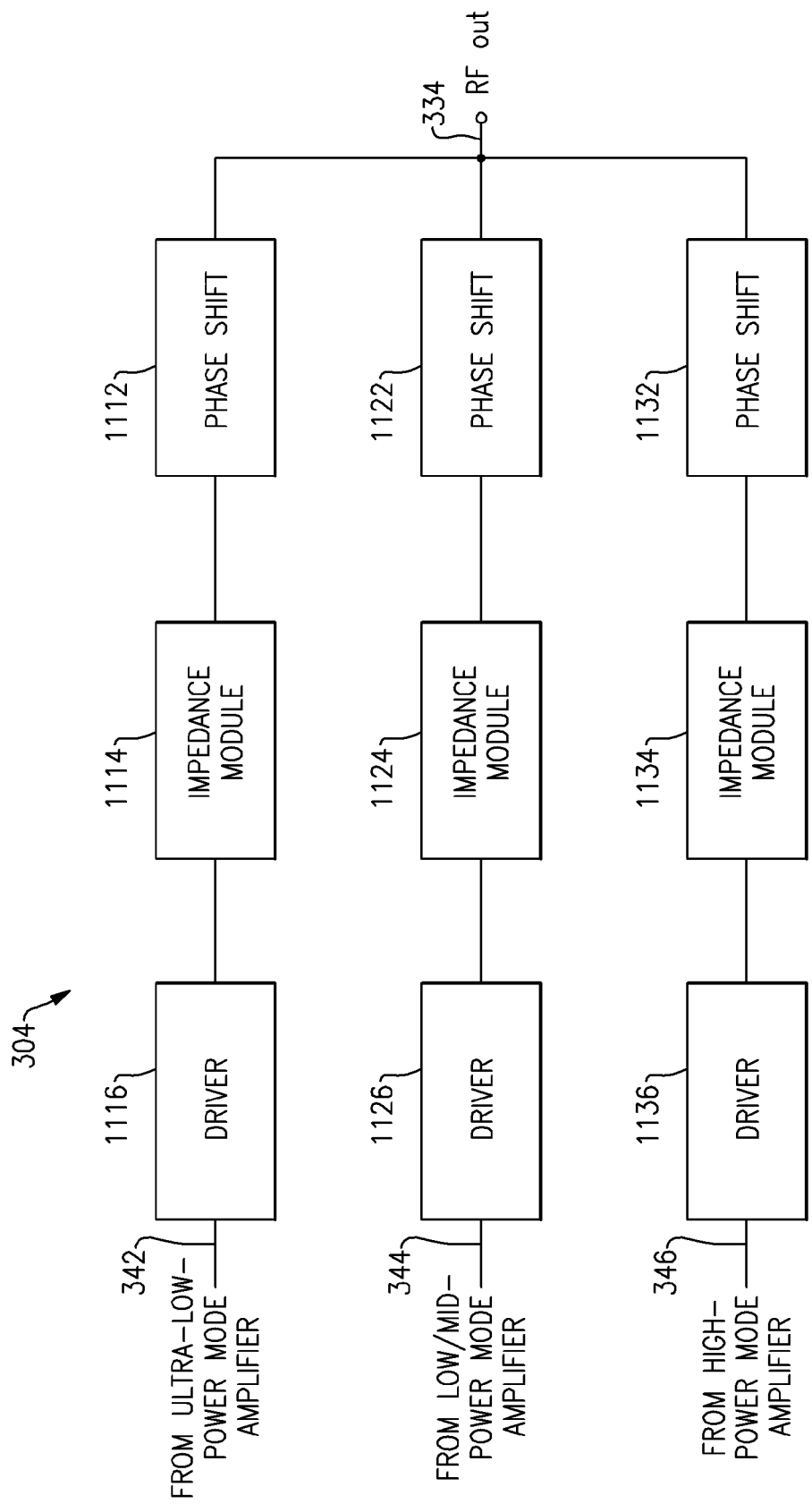
FIG. 11 is an exemplary schematic block diagram of a post-processing circuit for a multi-mode power amplifier, according to an embodiment.

FIG. 11 is an exemplary schematic block diagram of the multi-mode power amplifier post processing circuit 304. The post processing circuit 304 comprises a first driver circuit 1116, a first impedance module 1114, and a first phase shift circuit 1112 electrically coupled in series.

An input of the driver circuit 1116 receives the amplified output signal 342 from the ultra-low power amplifier circuit 316 and an output of the driver circuit provides an output signal with appropriate voltage levels and current to drive the RF output signal 334 to an input of the impedance module 1114. An input of the impedance module 1114 receives the output of the driver circuit 1112, transforms the signal through impedance matching, and provides an impedance matched signal to the phase shift circuit 1112. An input of the phase shift circuit 1112 receives the impedance matched signal and phase shifts it to generate a first phase shifted output signal 1118.

The post processing circuit 304 further comprises a second driver circuit 1126, a second impedance module 1124, and a second phase shift circuit 1122. In a manner similar to that described above with respect to circuits 1116, 1114, 1112, the driver circuit 1126 receives the output 344 of the mid-power mode amplifier circuit 312 and the phase shift circuit 1122 generates a second phase shifted output signal 1128.

The post processing circuit 304 further comprises a third driver circuit 1136, a third impedance module 1134, and a third phase shift circuit 1132. In a manner similar to that described above with respect to circuits 1116, 1114, 1112, the driver circuit 1126 receives the output 346 of the high-power mode amplifier circuit 310 and the phase shift circuit 1132 generates a third phase shifted output signal 1138.

The post processing circuit 304 combines the first, second and third phase shifted output signals 1118, 1128, 1138 to generate the RF output signal 334. The illustrated embodiment in FIG. 11 shows the driver circuit 1116, 1126, 1136 followed by the impedance module 1114, 1124, 1134, which is then followed by the phase shift circuit 1112, 1122, 1132, respectively. In other embodiments, other series arrangements are possible.

Referring to FIG. 3, the power amplifier circuit 300 operates in four power modes. In the ultra-low-power mode, the switch 330 is closed and the power cells/amplifiers 326 within the ultra-low-power mode amplifier circuit 316 are enabled. The remaining power cells/amplifiers 306, 308, 318, 320, 322, in the power amplifier 300 are disabled.

In the low, mid and high-power modes, the switch 330 is open and the ultra-low-power mode amplifier 316 is disabled. In the low-power mode, the power cells/amplifiers 320, 322 within the low-power mode amplifier 314 are enabled and the remaining power cells/amplifiers 306, 308, 318 within the high-power mode amplifier circuit 310 and the mid-power mode amplifier circuit 312 of the power amplifier 300 are disabled.

To provide additional output power, the power cell/amplifier 318 within the mid power amplifier 312, in addition to amplifiers 320, 322 of the low-power mode amplifier circuit 314, are enabled. The remaining power cells/amplifiers 306, 308 within the high-power mode amplifier circuit 310 of the power amplifier 300 are disabled.

The high-power mode provides yet more output power. In the high-power mode, the power cells/amplifiers 306, 308, 318, 320, 322 of the power amplifier 310 are enabled.

Figure 4:
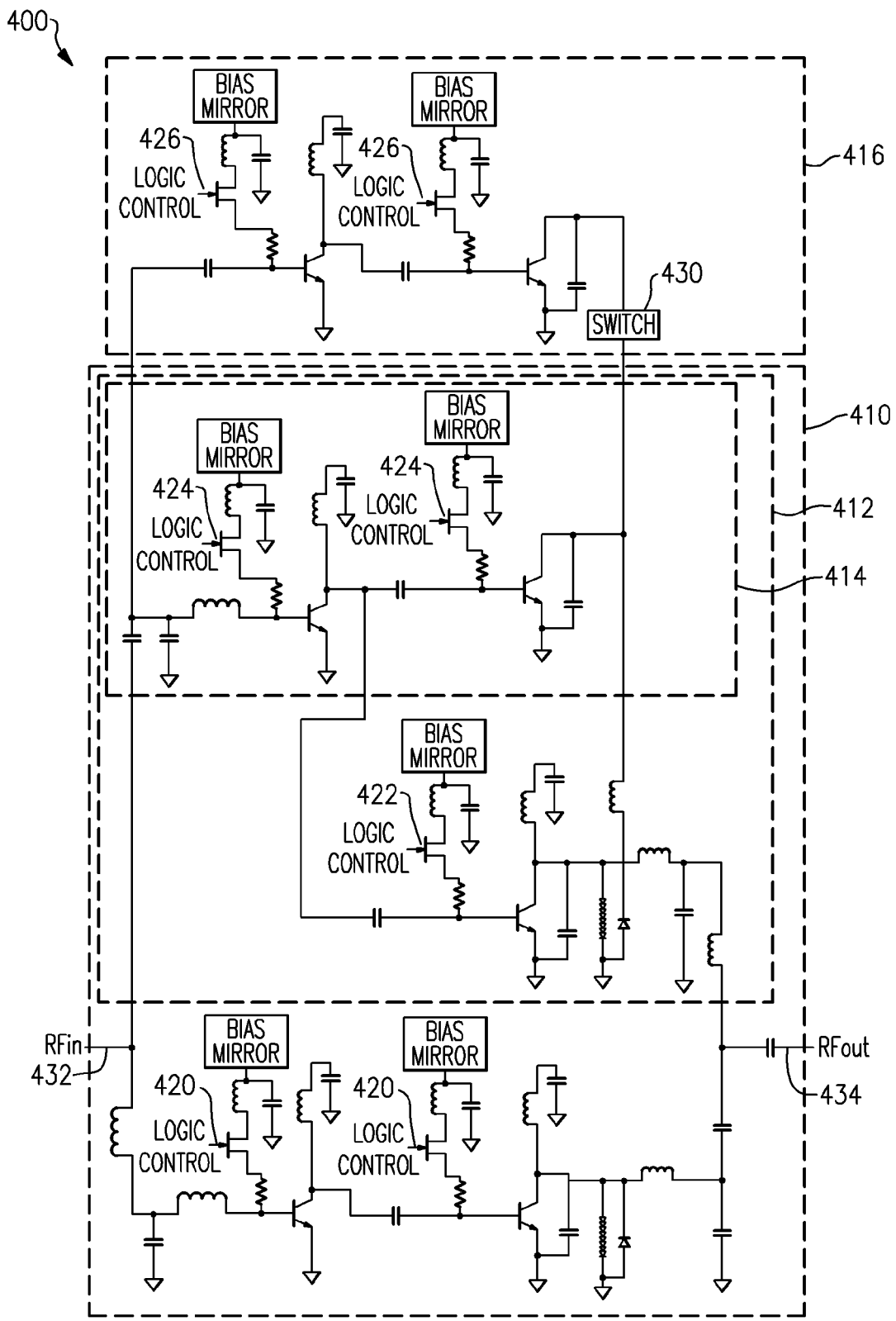
FIG. 4 is an exemplary schematic diagram illustrating an embodiment of the four-power-mode power amplifier, according to certain embodiments.

FIG. 4 is an exemplary schematic diagram illustrating an embodiment of a four-power-mode power amplifier 400. The power amplifier 400 comprises an ultra-low-power mode amplifier circuit 416 including a pHEMT switch 430. The power amplifier 400 further comprises a high-power mode amplifier circuit 410, a mid-power mode power amplifier circuit 414, and a low-power mode power amplifier circuit 412. The power amplifier 400 receives an RF input signal 432 and provides an amplified RF output signal 434. In an embodiment, the power amplifier 400 receives the RF input signal 432 from the transceiver 120 of the portable communication device 100, amplifies the RF input signal 432, and provides an RF output signal 434 to the TX/RX switch 142 on the front end module 130 of the portable communication device 100 for transmission by the antenna 146. The level or amount of amplification depends at least in part on the number of amplification paths that are enabled.

Each power amplifier circuit 410, 412, 414, 416 further comprises at least one logic control signal. The logic control signals determine whether one or more amplification paths within the power amplifier 400 are enabled. Control signal 426 enables or disables the ultra-low-power mode power amplifier 416. Likewise, control signal 424, control signal 422, and control signal 420 enable or disable the low-power mode power amplifier circuit 414, the mid-power mode power amplifier circuit 412, and the high-power mode power amplifier circuit 410, respectively.

In an embodiment, the baseband subsystem 110 provides the control signals 420, 422, 424, 426 over connection 152 to the power amplifier 400. The control signals 420, 422, 424, 426 can be used, for example, to vary the bias signal provided to the amplifier 400, such that the bias signal provides a reference voltage for biasing at least one current mirror used to generate a base current for the power amplifier 400 so as to selectively enable or disable the power amplifier circuits 410, 412, 414, 416.

Figure 5:
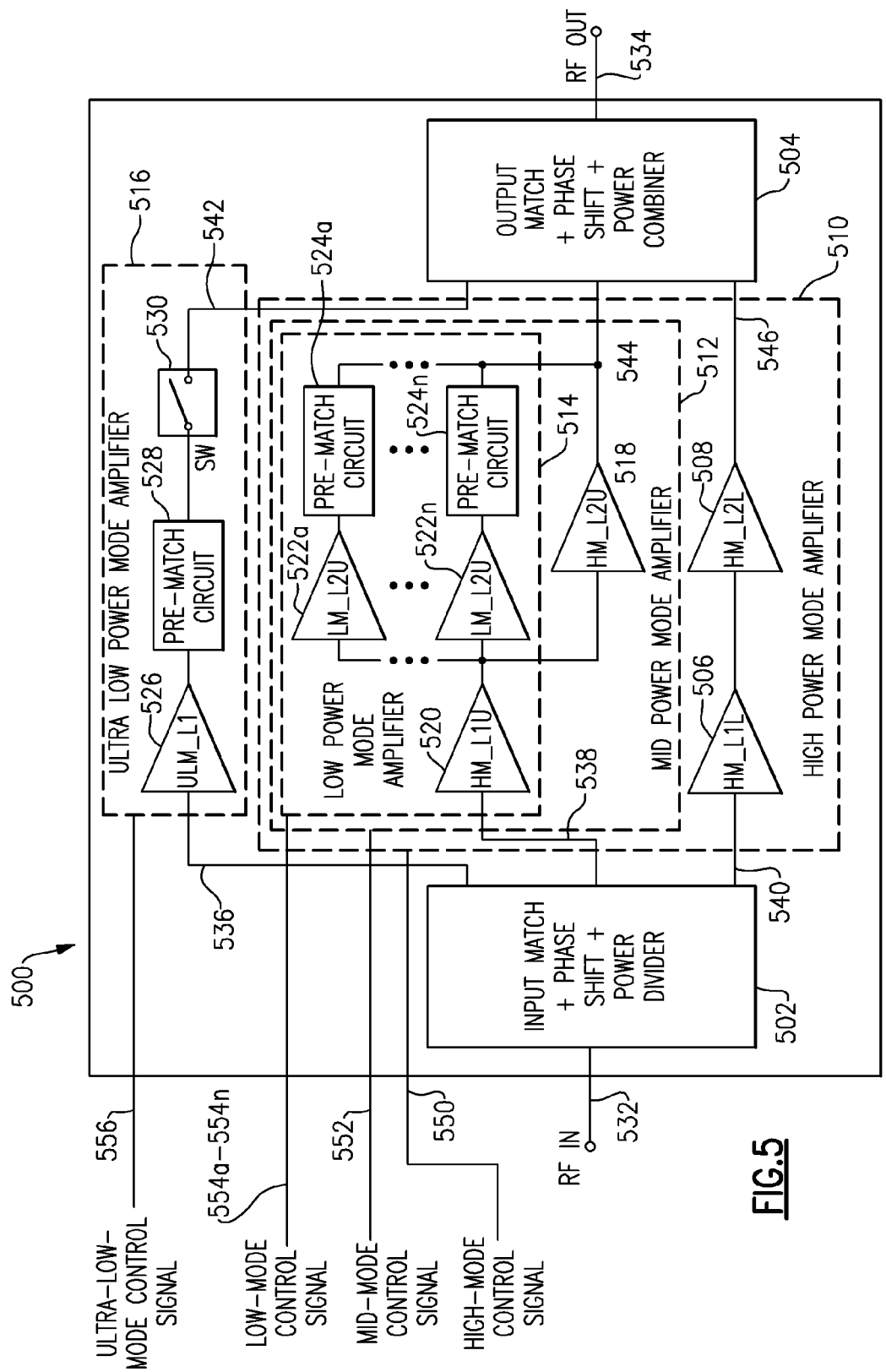
FIG. 5 is an exemplary schematic block diagram of a multi-mode power amplifier based on a load insensitive power amplifier structure and including an RF switch, according to certain embodiments.

FIG. 5 is an exemplary schematic block diagram of a multi-mode power amplifier 500 based on a load insensitive power amplifier structure. The power amplifier 500 receives an RF input signal 532 from, for example, the transceiver 120 of the portable communication device 100, amplifies the RF input signal 532, and provides an RF output signal 534 to, for example, the TX/RX switch 142 on the front end module 130 of the portable communication device 100 for transmission by the antenna 146. The multi-mode power amplifier 500 includes multiple selectable power modes including an optional ultra-low-power mode, up to N low-power modes, a mid-power mode, and a high-power mode, where the selection of the power mode depends at least in part on the level of power needed to transmit the RF signal. The power amplifier 500 comprises a multi-mode power amplifier preprocessing circuit 502, a high-power mode amplifier circuit 510, a mid-power mode amplifier circuit 512, a low-power mode amplifier circuit 514, an optional ultra-low-power mode amplifier circuit 516, and a multi-mode power amplifier post processing circuit 504.

The multi-mode power amplifier preprocessing circuit 502 receives the RF input signal 532, phase shifts, impedance matches, and power divides the RF input signal 532, and provides a first output signal 536 to the optional ultra-low-power mode amplifier circuit 516, a second output 538 to the low-power mode amplifier circuit 514, and a third output 540 to the high-power mode amplifier circuit 510 in a similar manner as the multi-mode preprocessing circuit 310 described above with respect to FIG. 10.

Referring to FIG. 5, the high-power mode amplifier circuit 510 comprises a first power/cell/amplifier 506 electrically coupled in series with a second power cell/amplifier 508. An input of amplifier 506 receives the preprocessing signal 540 from the preprocessing circuit 502 and an output of the amplifier 508 provides an amplified signal 546 to the post processing circuit 504. The high-power mode amplifier circuit 510 further comprises the mid-power mode amplifier circuit 512.

The mid-power mode amplifier circuit 512 comprises a power cell/amplifier 518 and a low-power mode amplifier circuit 514. An input of the amplifier 518 electrically couples to the low-power mode amplifier circuit 514 and an output of the amplifier 518 provides an amplifier signal 544 to the post processing circuit 504.

The low-power mode amplifier circuit 514 comprises a plurality of power cell/amplifiers 522a-522n and a corresponding plurality of pre-match circuits 524a-524n. Each amplifier 522a-522n electrically couples in series with its corresponding pre-match circuits 524a-524n to form N power cells. The N series combinations of the amplifier 522a-522n electrically coupled to its corresponding pre-match circuit 524a-524n electrically couple in parallel to form a bank of N selectable amplifier branches.

The amplifier circuit 514 further comprises an amplifier 520 electrically coupled in series with the parallel combination of N amplifier branches. An input of the amplifier 520 receives the preprocessed signal 538 from the preprocessing circuit 502, an output of the amplifier 520 electrically couples to an input of each amplifier 522a-522n of the bank of N amplifier branches, and to an input of the amplifier 518 of the mid-power mode amplifier circuit 512. An output of each pre-match circuit 524a-524n of the bank of N amplifier branches electrically couples to the post processing circuit 504 and to an output of the amplifier 518 of the mid-power mode amplifier circuit 512 to provide the amplified signal 544.

Each power amplifier 506, 508, 518, 520, and 522a-522n can comprise one or more power amplifiers electrically coupled in parallel.

The optional ultra-low-power mode amplifier circuit 516 comprises an amplifier 526, a pre-match circuit 528, and a radio frequency (RF) switch 530. An input of the amplifier 526 receives the preprocessed signal 536 from the preprocessing circuit 502, and an output of the amplifier 526 electrically connects to an input of the pre-match circuit 528. An output of the pre-match circuit 528 electrically connects to an input terminal of the switch 530. The output terminal of the switch 530 electrically connects to the post processing circuit 504 and provides, when the switch is closed, the amplified signal 542 to the post processing circuit 304. In an embodiment, the RF switch 530 is a pHEMT switch. The power amplifier 526 can comprise one or more power amplifiers electrically coupled in parallel.

The multi-mode power amplifier post processing circuit 504 receives the outputs of the power amplifier circuits 510, 512, 514, 516 and phase shifts, impedance matches and power combines these amplifier circuit output signals to generate the RF output signal 534 in a manner similar to that of post processing circuit 304 as described in FIG. 11 above.

Referring to FIG. 5, the power amplifier circuit 500 provides multiple power modes. In the optional ultra-low-power mode, the switch 530 is closed and the power cells/amplifiers 526 within the ultra-low-power mode amplifier circuit 516 are enabled. The remaining power amplifiers 506, 508, 518, 520, 522a-522n in the power amplifier 500 are disabled. In an embodiment, the optional ultra-low-power mode amplifier 526 is enabled when collector impedance is not practical.

In the low, mid and high-power modes, the switch 530 is open and the optional ultra-low-power mode amplifier 516 is disabled. The multi-mode power amplifier 500 provides multiple power levels by selectively enabling the high-power mode amplifier circuit 510, the mid-power mode amplifier circuit 512 or the low-power mode amplifier circuit 514. Further, the multi-mode power amplifier 500 provides additional power levels by selectively enabling more or less power cells/amplifiers 522a-522n in the low-power mode amplifier circuit 514.

For example, to provide greater amplification to the RF input signal 532, all of the power cells/amplifiers in the amplifier circuits 510, 512, 514 are enabled. In another example, to provide less amplification, one branch of the N selectable amplification branches in the low-power mode amplifier circuit 514 is enabled. Multiple power modes are achievable by selectively enabling more than one amplifier branch and less than all the amplifiers in the power amplifier 500.

In a high-power mode embodiment, the power cells/amplifiers 506, 508, 518, 520, 522a-522n of the high-power mode amplifier 510, which includes the mid and low-power mode amplifier circuits 512, 514, are enabled. If less power is desired, the power cells/amplifiers 518, 520, 522a-522n of the mid-power mode power amplifier circuit 512, which includes the low-power mode amplifier circuit 514, are enabled and power cells/amplifiers 506, 508 are disabled.

The low-power mode power amplifier circuit provides up to N power levels. When even less power is desired, the branches of the bank of N power cells in the low-power mode power amplifier circuit 514 can be selectively enabled/disabled to achieve the desired power level. For example, in a first low-power mode, power cells/amplifiers 520, 522a-522n are enabled and power cells/amplifiers 506, 508, 518, are disabled. As the desired level of power decreases, fewer power cells/amplifiers 522a-522n are enabled. For example, for the least power level provided by the low-power mode power amplifier circuit 514, power cells/amplifiers 520 and 522n are enabled and power cells/amplifiers 506, 508, 518, 522a-522(n−1) are disabled.

Each power amplifier circuit 516, 510, 512, 514 further comprises at least one logic control signal. The logic control signals determine whether one or more amplification paths within the power amplifier 500 are enabled. Control signal 556 controls whether the ultra-low-power mode power amplifier 516 is enabled or disabled. Likewise, a control signal 552 and a control signal 550 enable or disable the mid-power mode power amplifier 512 and the high-power mode power amplifier 510, respectively. The low-power mode power amplifier circuit 514 further comprises a plurality of control signals 554a-554n, where each of the plurality of control signals 554a-554n enables or disables a corresponding amplifier 522a-522n in the low-power mode power amplifier circuit 514. In an embodiment, the baseband subsystem 110 provides the control signals 550, 552, 554a-554n, 556 over connection 152 to the power amplifier 500.

The amplifiers 300, 400, 500 described above utilize a switched load insensitive power amplifier structure for high, mid and low-power modes, and an RF switch, such as a pseudomorphic High Electron Mobility Transistor (pHEMT) switch for an ultra-low-power mode amplifier circuit. Due to the interaction between the two types of switched amplifier branches in a multi-mode power amplifier, the use of the pHEMT switch imposes additional requirements on the layout of the power amplifier die, imposes additional requirements on the layout of the module laminate and requires additional effort to tune the power amplifier to meet electrical performance and physical size requirements.

In addition, the pHEMT switch has several limitations. The pHEMT switch has loss, which directly translates into lower efficiency or less linearity in low-power modes. Further, the pHEMT amplifier branch provides input loading which creates difficulty in designing an input matching network to satisfy the input return loss requirements for both the high and the ultra-low-power modes. Further yet, the switch is costly and bulky.

Eliminating the switch and its associated amplifier branch reduces costs and simplifies the amplifier structure. The new structure maintains the switched load insensitive power amplifier structure, but splits output array cells of one side into several groups depending on the power modes required. This reshapes the impedances presented to each of these groups by adding matching circuits in between the split cell collectors. In an embodiment, the multi-mode power amplifier without an RF switch improves low-power mode performance, improves the input return loss of the amplifier in the high, mid and low-power modes, and maintains approximately the same high and mid-power mode performance as a multi-mode power amplifier including an RF switch.

Figure 6:
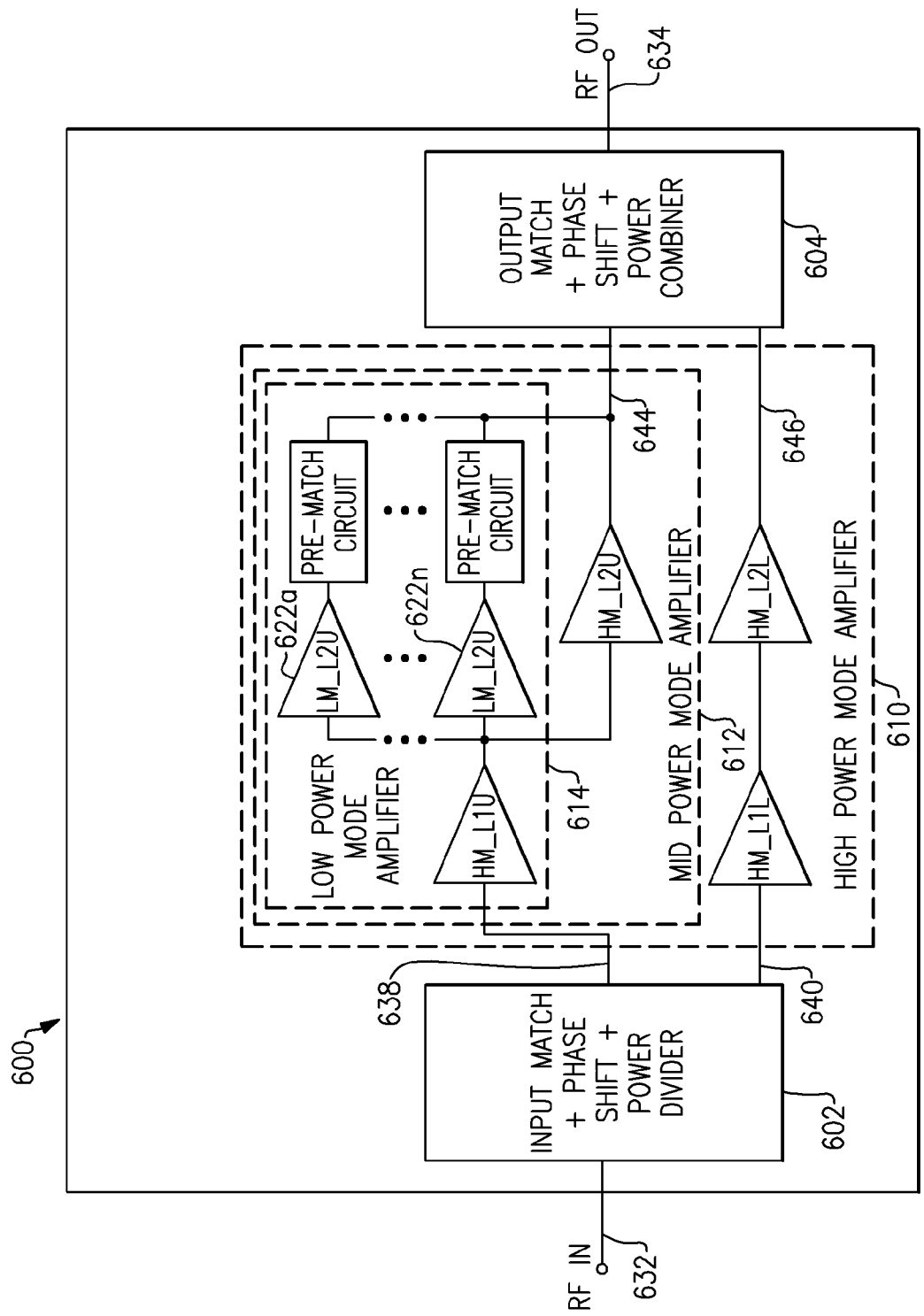
FIG. 6 is an exemplary schematic block diagram of a multi-mode power amplifier based on a load insensitive power amplifier structure without an RF switch, according to certain embodiments.

FIG. 6 is an exemplary schematic block diagram of a multi-mode power amplifier 600 based on a load insensitive power amplifier structure without an RF switch. In an embodiment, the power amplifier 600 receives an RF input signal 632 from, for example, the transceiver 120 of the portable communication device 100, amplifies the RF input signal 632, and provides an RF output signal 634 to, for example, the TX/RX switch 142 on the front end module 130 of the portable communication device 100 for transmission by the antenna 146. The multi-mode power amplifier 600 includes multiple selectable power modes including up to N low-power modes, a mid-power mode, and a high-power mode, where the selection of the power mode depends at least in part on the level of power needed to transmit the RF signal 634.

The power amplifier 600 comprises a multi-mode power amplifier preprocessing circuit 602, a high-power mode amplifier circuit 610, a mid-power mode amplifier circuit 612, a low-power mode amplifier circuit 614, and a multi-mode power amplifier post processing circuit 604. The power amplifier 600 operates similarly to that of the power amplifier 500 described above, but without an ultra-low-power mode amplifier circuit that includes an RF switch.

For the high-power mode, the high-power mode amplifier circuit 610, which includes the mid-power mode amplifier circuit 612 and the low-power mode amplifier circuit 614, is turned on. For the mid-power mode, the mid-power mode amplifier circuit 612, which includes the low-power mode amplifier circuit 614, is turned on. For low and ultra-low-power modes, a small portion of the power cells in the low-power mode amplifier circuit are turned on. Since the high-power mode amplifier circuit 610 is tuned for lower impedance to achieve high-power mode performance, the mid-power mode amplifier circuit 612 is tuned for optimal mid-power mode performance. After the impedance transformation, the high impedance can be adjusted conveniently to the split collector for the low and ultra-low-power mode requirement.

The multi-mode power amplifier preprocessing circuit 602 receives the RF input signal 632, phase shifts, impedance matches, and power divides the RF input signal 632, and provides a first output signal 638 to the low-power mode amplifier circuit 614, and a second output signal 640 to the high-power mode amplifier circuit 610 in a similar manner as the multi-mode preprocessing circuit 310 described above with respect to FIG. 10.

The multi-mode power amplifier post processing circuit 604 receives an output signal 644 from the low-power mode amplifier circuit 614 and an output signal 646 from the high-power mode amplifier circuit 610, and phase shifts, impedance matches and power combines these amplifier circuit output signals 644, 646 to generate the RF output signal 634 in a manner similar to that of post processing circuit 304 as described in FIG. 11 above.

The high-power mode amplifier circuit 610, the mid-power mode amplifier circuit 612 and the low-power mode amplifier circuit 614 operate in a similar manner to the high-power mode amplifier circuit 510, the mid-power mode amplifier circuit 512 and the low-power mode amplifier circuit 514 described above with respect to FIG. 5.

The multi-mode power amplifier 600 provides multiple power levels by selectively enabling the high-power mode amplifier circuit 610, and/or the mid-power mode amplifier circuit 612 and/or the low-power mode amplifier circuit 614. Advantageously, the multi-mode power amplifier 600 provides up to N additional low power levels by selectively enabling more or fewer power cells/amplifiers 622a-622n in the low-power mode amplifier circuit 614 without the impedance mismatch or board layout problems associated with an RF switch.

Figure 7:
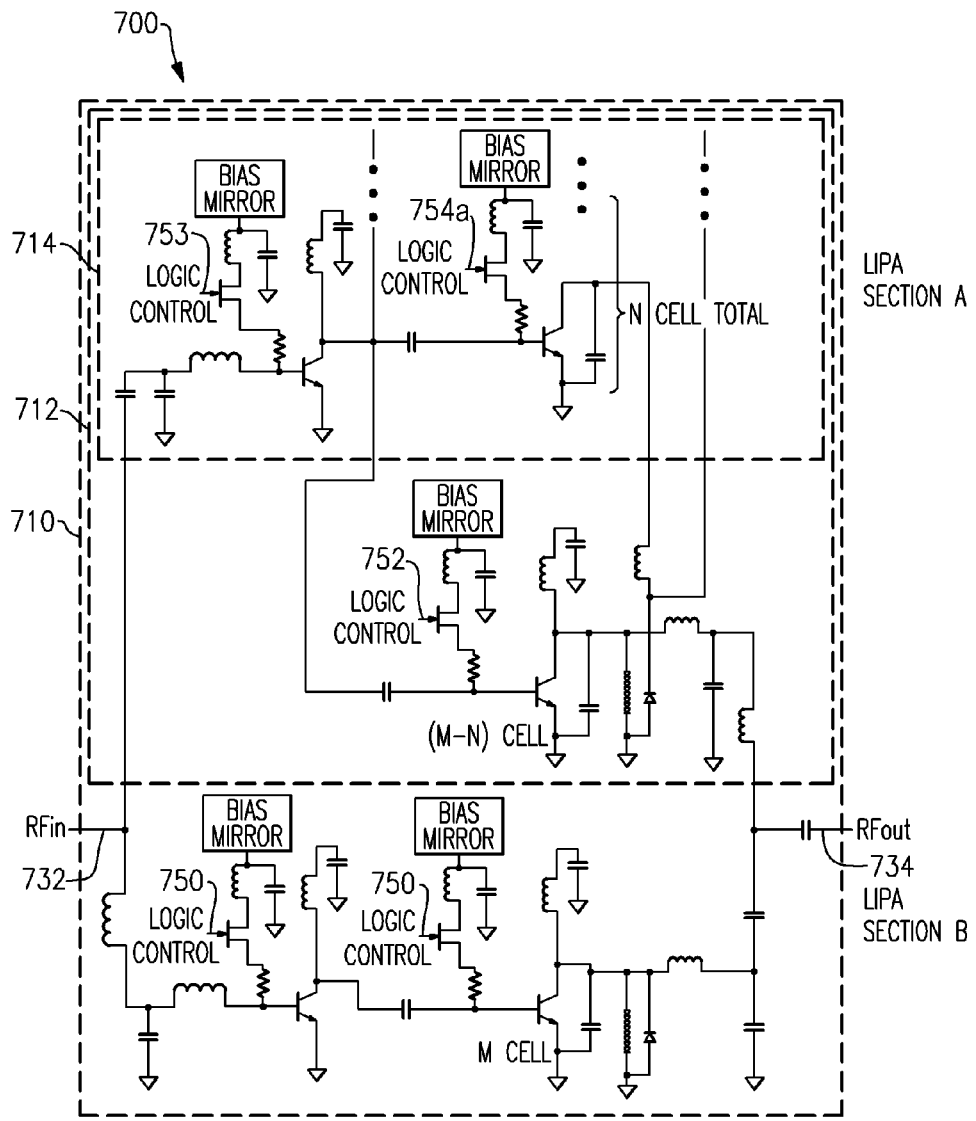
FIG. 7 is an exemplary schematic diagram illustrating an embodiment of a multi-mode power amplifier without an RF switch, according to certain embodiments.

FIG. 7 is an exemplary schematic diagram illustrating an embodiment of a multi-mode power amplifier 700 based on a load insensitive power amplifier structure without an RF switch. The power amplifier 700 comprises a high-power mode amplifier circuit 710, a mid-power mode power amplifier circuit 714, and a low-power mode power amplifier circuit 712. The power amplifier 700 receives an RF input signal 732 from, for example, the transceiver 120 of the portable communication device 100, and provides an amplified RF output signal 734 to, for example, the TX/RX switch 142 on the front end module 130 of the portable communication device 100. The level or amount of amplification depends at least in part on the number of amplification paths that are enabled.

As described above with respect to FIG. 4, each power amplifier circuit, 710, 712, 714 further comprises at least one logic control signal. The logic control signals determine whether one or more amplification paths within the power amplifier 700 are enabled. Control signal 752 enables/disables the mid-power mode amplifier circuit 712, a control signal 750 enables/disables the high-power mode amplifier circuit 710. Control signal 753 enables/disables at least part of the low-power mode amplifier circuit 714.

The low-power mode power amplifier circuit 714 further comprises a plurality of control signals 754a-754n, where each of the plurality of control signals 754a-754n enables or disables a corresponding amplifier 722a-722n in the low-power mode power amplifier circuit 714. In an embodiment, the baseband subsystem 110 provides the control signals 750, 752, 754a-754n over connection 152 to the power amplifier 700.

Figure 8:
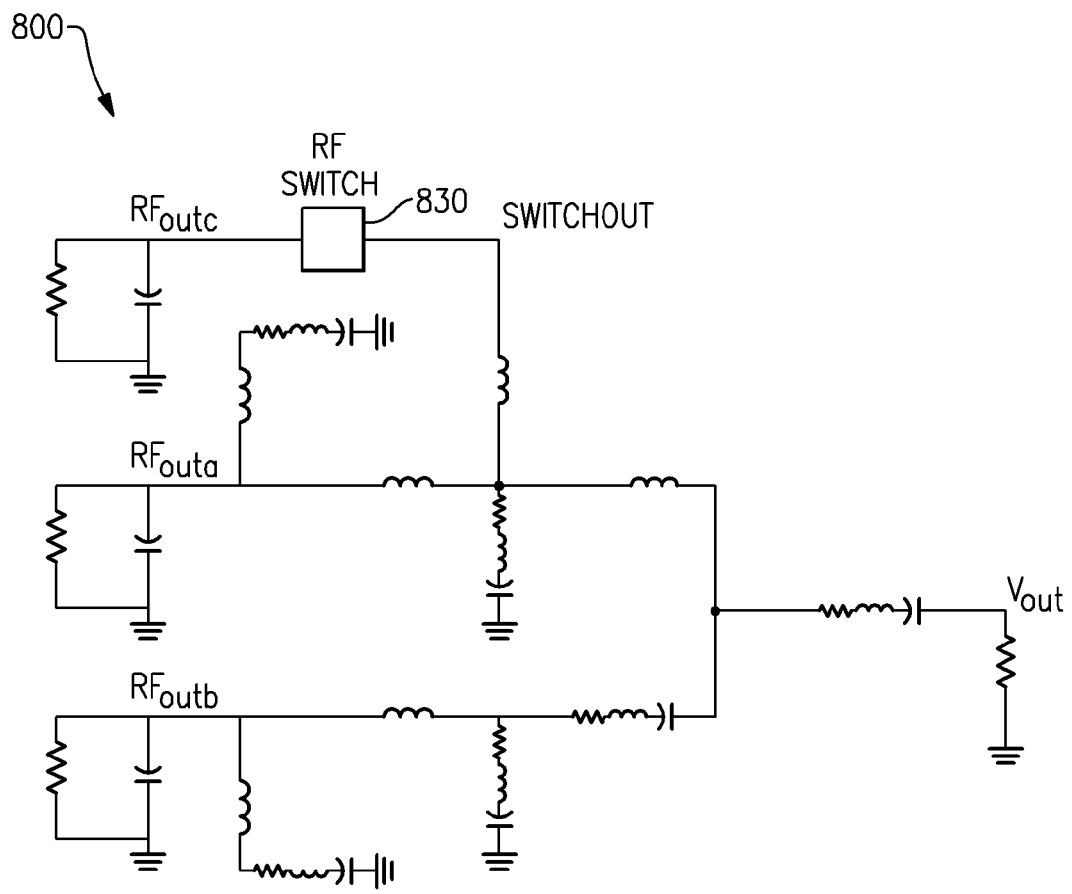
FIG. 8 is an exemplary schematic diagram illustrating an embodiment of an output matching network for a four-power-mode power amplifier using an RF switch, according to an embodiment.

FIG. 8 is an exemplary schematic diagram illustrating an embodiment of an output matching network 800 for a four-power-mode power amplifier 300, 400 using an RF switch 830.

Figure 9:
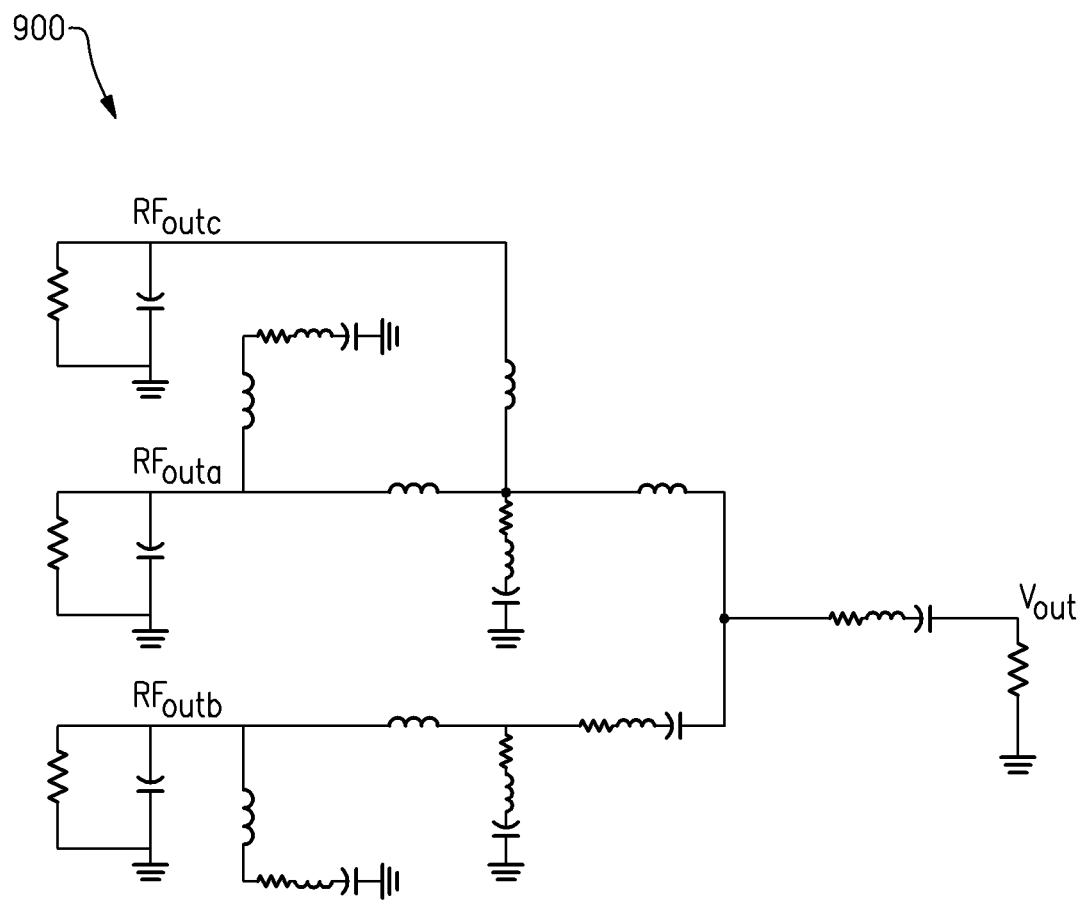
FIG. 9 is an exemplary schematic diagram illustrating an embodiment of an output matching network for a four-power-mode power amplifier without an RF switch, according to an embodiment.

FIG. 9 is an exemplary schematic diagram illustrating an embodiment of an output matching network 900 for a four-power-mode power amplifier not using an RF switch.

Although described with particular reference to a portable communication device, such as a portable cellular telephone or a personal digital assistant (PDA), the multi-mode power amplifier, also referred to in an alternative embodiment as the balanced linear power amplifier or linear power amplifier, can be used in any device or system that amplifies a transmit signal using at least two power amplification paths. The multi-mode power amplifier can be implemented as part of an integrated module that contains other circuit elements, or can be implemented as a discrete power amplification module. The multi-mode power amplifier can be implemented in hardware, software, or a combination of hardware and software.

When implemented in hardware, the multi-mode power amplifier can be implemented using specialized hardware elements and control logic. When the multi-mode power amplifier is implemented partially in software, or implemented in a system that employs software control of various elements or components, the software portion can be used to precisely control the various components of the multi-mode power amplifier. The software can be stored in a memory and executed by a suitable instruction execution system (microprocessor). The hardware implementation of the multi-mode power amplifier can include any or a combination of the following technologies, which are all well known in the art: discrete electronic components, integrated electronic components, a discrete logic circuit(s) having logic gates for implementing logic functions upon data signals, an application specific integrated circuit having appropriate logic gates, a programmable gate array(s) (PGA), a field programmable gate array (FPGA), or the like.

The software for multi-mode high efficiency linear power amplifier comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The words "coupled" or "connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of certain embodiments is not intended to be exhaustive or to limit the invention to the precise form disclosed above. While specific embodiments of, and examples for, the invention are described above for illustrative purposes, various equivalent modifications are possible within the scope of the invention, as those ordinary skilled in the relevant art will recognize in view of the disclosure herein.

For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the systems described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A multi-mode power amplifier comprising:
a high-power mode amplifier circuit including a high-power mode control signal which enables the high-power mode amplifier circuit;
a mid-power mode amplifier circuit including a mid-power mode control signal which enables the mid-power mode amplifier circuit, the mid-power mode control signal distinct from the high-power mode control signal; and
a low-power mode amplifier circuit including a plurality of independently selectable amplifier branches, each amplifier branch including a corresponding low-power mode control signal, each of the low-power mode control signals independent from others of the low-power mode control signals and independent from the high and mid-power mode control signals such that selecting certain of the power modes reduces the power consumption of the multi-mode power amplifier.

2. The amplifier of claim 1 wherein a high-power mode occurs when the high-power mode amplifier circuit, the mid-power mode amplifier circuit, and the low-power mode amplifier circuit are enabled.

3. The amplifier of claim 2 wherein a mid-power mode occurs when the mid-power mode amplifier circuit and the low-power mode amplifier circuit are enabled and the high-power mode amplifier circuit is disabled.

4. The amplifier of claim 3 wherein a low-power mode occurs when at least one of the branches of the low-power mode amplifier circuit is enabled and the high-power mode amplifier circuit and the mid-power mode amplifier circuit are disabled.

5. The amplifier of claim 1 further comprising an ultra-low-power mode amplifier circuit including a radio frequency (RF) switch.

6. The amplifier of claim 5 wherein the RF switch is a pseudomorphic high electron mobility transistor (pHEMT) switch.

7. The amplifier of claim 1 further comprising a preprocessing circuit.

8. The amplifier of claim 7 wherein the preprocessing circuit includes a first phase shift element, a first impedance module and a first driver circuit.

9. The amplifier of claim 8 further comprising a post processing circuit.

10. The amplifier of claim 9 wherein the post processing circuit includes a second phase shift element, a second impedance module and a second driver circuit.

11. A portable communication device comprising:
a baseband subsystem configured to provide a baseband information signal and including a processor configured to generate control signals;
a transceiver configured to convert the baseband information signal to a radio frequency (RF) signal for amplification and transmission;
a multi-mode power amplifier configured to amplify the RF signal, the multi-mode power amplifier including a high-power mode amplifier circuit including a high-power mode control signal which enables the high-power mode amplifier circuit, a mid-power mode amplifier circuit including a mid-power mode control signal which enables the mid-power mode amplifier circuit, the mid-power mode control signal distinct from the high-power mode control signal, and a low-power mode amplifier circuit including a plurality of independently selectable amplifier branches, each amplifier branch including a corresponding low-power mode control signal, each of the low-power mode control signals independent from others of the low-power mode control signals and independent from the high and mid-power mode control signals, the high, mid, and low power mode control signals generated by the processor such that selecting certain of the power modes reduces the power consumption of the multi-mode power amplifier; and
an antenna configured to transmit the amplified RF signal.

12. The portable communication device of claim 11 wherein a high-power mode occurs when the high-power mode amplifier circuit, the mid-power mode amplifier circuit, and the low-power mode amplifier circuit are enabled.

13. The portable communication device of claim 12 wherein a mid-power mode occurs when the mid-power mode amplifier circuit and the low-power mode amplifier circuit are enabled and the high-power mode amplifier circuit is disabled.

14. The portable communication device of claim 13 wherein a low-power mode occurs when at least one of the branches of the low-power mode amplifier circuit is enabled and the high-power mode amplifier circuit and the mid-power mode amplifier circuit are disabled.

15. The portable communication device of claim 11 further comprising an ultra-low-power mode amplifier circuit including a radio frequency (RF) switch.

16. The portable communication device of claim 15 wherein the RF switch is a pseudomorphic high electron mobility transistor (pHEMT) switch.

17. The portable communication device of claim 11 further comprising a preprocessing circuit.

18. The portable communication device of claim 17 wherein the preprocessing circuit includes a first phase shift element, a first impedance module, and a first driver circuit.

19. The portable communication device of claim 18 further comprising a post processing circuit.

20. The portable communication device of claim 19 wherein the post processing circuit includes a second phase shift element, a second impedance module, and a second driver circuit.

* * * * *